(12) United States Patent
Kirsch

(10) Patent No.: US 8,150,130 B2
(45) Date of Patent: *Apr. 3, 2012

(54) MAGNETIC RESONANCE METHOD AND APPARATUS FOR PRODUCING AN ANGIOGRAPHIC IMAGE

(75) Inventor: Rainer Kirsch, Berlin (DE)

(73) Assignee: Siemens Aktiengesellschaft, Munich (DE)

( * ) Notice: Subject to any disclaimer, the term of this patent is extended or adjusted under 35 U.S.C. 154(b) by 893 days.

This patent is subject to a terminal disclaimer.

(21) Appl. No.: 12/166,769

(22) Filed: Jul. 2, 2008

(65) Prior Publication Data

US 2009/0010513 A1    Jan. 8, 2009

(30) Foreign Application Priority Data

Jul. 2, 2007  (DE) .................. 10 2007 030 746

(51) Int. Cl.
*G06K 9/00* (2006.01)
(52) U.S. Cl. ....................... 382/131; 600/410
(58) Field of Classification Search .................. 382/128, 382/130–132; 600/410, 419, 420
See application file for complete search history.

(56) References Cited

U.S. PATENT DOCUMENTS 7,917,191 B2 * 3/2011 Kirsch ................... 600/410
2003/0011368 A1 1/2003 Abe

OTHER PUBLICATIONS

"Dynamic, Contrast Enhanced, NMR Perfusion Imaging of Regional Cerebral Ischaemia in Rats Using k space Substitution," Jones et al., Proc. SMR 1992, p. 1138.
"Limitations of the Keyhole Technique for Quantitative Dynamic Contrast-Enhanced Breast MRI," Bishop et al., J. Mag. Reson. Imag., vol. 7, No. 4, (1997) pp. 716-723.

* cited by examiner

*Primary Examiner* — Jurie Yun
(74) *Attorney, Agent, or Firm* — Schiff Hardin LLP

(57) ABSTRACT

In a magnetic resonance method and apparatus for generation of an angiographic image of a vascular system of a patient, a first data set of k-space data of the region to be examined is acquired using a contrast agent-free magnetic resonance angiography technique, a second data set of k-space data of the region to be examined is acquired using a contrast agent-assisted magnetic resonance angiography technique, and an angiographic image of the region to be examined is produced using both the first measurement data of the first data set and the second measurement data of the second data set.

11 Claims, 4 Drawing Sheets

MAGNETIC RESONANCE METHOD AND APPARATUS FOR PRODUCING AN ANGIOGRAPHIC IMAGE

BACKGROUND OF THE INVENTION

1. Field of the Invention

The present invention concerns a method for generation of an angiographic image by magnetic resonance, as well as a magnetic resonance apparatus for implementation of such a method.

2. Description of the Prior Art

Magnetic resonance technology has been increasingly used in recent years to generate angiographic images since, relative to other medical imaging modalities such as, for example, radioscopy with x-rays or computed tomography, it has among other things, the advantage that patient and medical personal are subjected to no radiation exposure.

Magnetic resonance (MR) technology is a known technology with which images of the inside of an examination subject can be generated. For this purpose, the examination subject is positioned in a strong, static, homogeneous basic magnetic field (field strengths of 0.2 Tesla to 7 Tesla and higher) in an MR apparatus so that the subject's nuclear spins become oriented along the basic magnetic field. Radio-frequency excitation pulses are radiated into the examination subject to excite nuclear magnetic resonances, the excited nuclear magnetic resonances being measured (detected and MR images being reconstructed based thereon. For spatial coding of the measurement data, rapidly switched magnetic gradient fields are superimposed on the basic magnetic field. The acquired measurement data are digitized and stored as complex numerical values in a k-space matrix. An associated MR image can be reconstructed from the k-space matrix populated with such values by means of a multi-dimensional Fourier transformation.

Magnetic resonance technology can thereby also be used in magnetic resonance angiography (MRA) to generate an angiograph with the use of a special MR pulse sequence suitable for this purpose. Known MRA techniques are, for example, time-of-flight (TOF) angiography and phase contrast angiography.

Another possibility to generate an angiograph with the use of magnetic resonance technology involves the use of a contrast agent, for example based on gadolinium. The contrast agent is injected into the vascular system of a patient so that it highlights the structures of the vascular system relative to surrounding tissue after subsequent propagation in the vascular system.

SUMMARY OF THE INVENTION

An object of the invention is to provide a method for generation of an angiographic image with the use of MR technology that allows a high resolution of the depiction of the vascular system (in particular of arteries) with simultaneous good contrast-noise ratio and contrast response. Furthermore, it is the object of the invention to provide a magnetic resonance apparatus with which such an angiographic image can be acquired.

The method according to the invention for generation of an angiographic image of a vascular system of a body to be examined with the aid of magnetic resonance technology includes the steps of acquiring a first data set of the region to be examined using a contrast agent-free magnetic resonance angiography technique, acquiring a second data set of the region to be examined using a contrast agent-aided magnetic resonance angiography technique, and generating an angiographic image of the region to be examined using both first measurement data of the first data set and second measurement data of the second data set.

The invention is based on combining two different techniques in order to obtain from the measurement data that have respectively been acquired with each of the techniques, an image in which both measurement data are combined. This means that acquired k-space data of the first data set and the acquired k-space data of the second data set are combined in order to generate an angiographic image.

The inventive method is based on the insight that the use of a contrast agent-free MRA technique (such as, for example, a time-of-flight angiography technique) alone can provide only a relatively low-resolution image data set with good contrast-noise ratio, and that, using a contrast agent-assisted MRA technique, often only a short time window is available in order to acquire data from a desired segment of the vascular system (such as, for example, the arterial vascular system), so that with a contrast agent-assisted technique as well, the generation of a high-resolution image data set that depicts the arterial vascular system in good quality is only conditionally possible.

Only by a combination of both techniques can high-resolution angiographic images with an improved contrast-noise ratio and contrast response be acquired. This is produced by using both the first measurement data of the first data set and the second measurement data of the second data set to reconstruct the image. Peripheral k-space regions (thus regions that code high spatial frequencies) can be acquired with one technique and central k-space regions (that characterize the contrast response) can be acquired with the other technique. Due to the combination of both measurement data an angiographic image exhibits the resolution of the one technique wherein the image contrast and the contrast-noise ratio are predominantly determined by the other technique.

A hybrid data set is advantageously generated from the first measurement data of the first data set and from the second measurement data of the second data set. The angiographic image can subsequently be generated from the hybrid data set in that a Fourier transformation is applied.

The combination of the first measurement data and the second measurement data consequently occurs in k-space. It is thus possible in a simple manner to match contrast response and high spatial frequencies to the respective acquisition techniques since high spatial frequencies are predominantly determined via peripheral k-space regions while the contrast response (i.e. the image contrast) is determined by central k-space regions.

In a first embodiment the hybrid data set is generated in k-space such that a central k-space region of the hybrid data set is populated with first measurement data of the first data set, and a peripheral k-space region of the hybrid data set is populated with second measurement data of the second data set.

A contrast agent-free angiography technique enables the acquisition of a first data set that typically exhibits only a relatively low resolution with good contrast-noise ratio or contrast response. These properties of the first data set correspond in k-space to a first central k-space region that is populated with the first measurement data of the first data set. In the hybrid data set the corresponding k-space region is populated with these first measurement data.

By contrast, the contrast agent-assisted angiography technique enables the acquisition of a second data set that possesses a comparably high resolution in which, however, both arteries and veins are typically shown with good contrast. Of the second data set, measurement data in a peripheral k-space region are now used in order to populate the corresponding k-space region in the hybrid data set.

In this manner the first measurement data of the first data set are completed with measurement data of the second measurement data set in the hybrid data set. A high resolution in a reconstructed image is hereby enabled in which the contrast response (i.e. the image contrast) is predominantly determined via the contrast agent-free angiography technique.

In another embodiment the hybrid data set is generated in k-space in that the first measurement data of the first data set and the second measurement data of the second data set are added with weighting. The weighting ensues such that the first measurement data of the first data set are more strongly weighted in a central k-space region than the second measurement data of the second data set, and in a peripheral k-space region the second measurement data of the second data set is more strongly weighted than the first measurement data of the first data set.

A sliding transition between the first measurement data and the second measurement data can be achieved with the use of the weighting, such that a steady behavior of the measurement data in k-space is ensured. A better image quality thus can be achieved. Moreover, the weighted addition can be flexibly adapted in a simple manner by, for example, changing the parameters that characterize the weighted addition. The method thus can be modified in a simple manner in order to vary an image contrast or a resolution in the reconstructed image and to correspondingly adapt the requirements.

Populating a central k-space region of the hybrid data set is populated with the first measurement data of the first data set and populating a peripheral k-space region with the second data measurement data of the second data set is merely a special case of weighted addition. In the central k-space region, the weighting is exclusively of the first measurement data while in the peripheral k-space region the weighting is exclusively of the second measurement data.

In a further embodiment, the first data set and the second data set are acquired such that both data sets exhibit the same dimensions in image space. In this manner the two data sets can be combined into a hybrid data set in k-space in a simple manner.

In the acquisition of the first measurement data a k-space region is advantageously scanned that lies inside a second k-space region that is scanned by the second measurement data. The acquisition of the measurement data is hereby already adapted to the later, following combination in which a peripheral k-space region is populated with the second measurement data and in which a central k-space region is populated with the first measurement data and/or with a weighted addition of the first measurement data and the second measurement data.

In a further embodiment the second data set has a higher spatial resolution in image space (the image domain) than the first data set. In this way it is ensured in a simple manner that the high spatial frequencies can be provided by the second data set.

In a further embodiment, the contrast agent-free magnetic resonance angiography technique is a time-of-flight angiography technique that is in particular fashioned such that an arterial region of the vascular system is shown by the acquired measurement data.

This angiography technique enables a relatively low-resolution image data set to be acquired with good contrast-noise ratio. The contrast response can be selected or set such that the arterial region of the vascular system is shown. Through the expansion of these acquired measurement data with the measurement data that have been acquired with a contrast agent-assisted MRA technique, it is now possible to obtain a high-resolution image data set in which the arterial segment of a vascular system is well and clearly depicted.

TOF angiography is a known MR technique for depiction of vascular systems. Vessels are made visible in that unsaturated, completely relaxed spin ensembles that flow into a slice or a volume generate a high signal intensity. In comparison to this, stationary spin ensembles are partially saturated and therefore deliver a relatively low signal intensity. Vessels are presented with a distinctly higher signal intensity than surrounding, stationary tissue. A gradient echo sequence with a short repetition time TR is typically used to acquire the measurement data in a TOF angiography.

In a further embodiment, the contrast agent-assisted magnetic resonance angiography technique is implemented at a point in time at which a contrast agent introduced into the vascular system to be examined is located both in arteries and in veins.

The propagation speed of the contrast agent depends in a known manner on the vascular system to be examined and on the pathologies present therein. As the contrast agent disperses, it is located primarily in arterial vessels during a first phase (known as the arterial phase), while venous vessels are not yet filled by the contrast agent. Only in a second phase (known as the equilibrium phase) has the contrast agent distributed so far in the vascular system that it is located both in the arteries and in the veins. The arterial phase typically lasts a few seconds until it is displaced by the equilibrium phase, which lasts significantly longer (typically several minutes).

If the contrast agent-assisted MRA technique is now implemented during the equilibrium phase, a comparably longer time span is available for acquisition of measurement data, such that a high resolution and an acquisition of image data with high spatial frequencies can be ensured without problems.

In a further embodiment, the first data set and the second data set are acquired in succession in a single magnetic resonance examination.

In this manner a fast implementation of the examination is enabled. A suitable field of use for the method is an examination of the cranial vascular system.

The above object also is achieved in accordance with the present invention by a magnetic resonance apparatus that is configured to implement the above-described method, including all of the above-described embodiments thereof.

DESCRIPTION OF THE PREFERRED EMBODIMENTS

Figure 1:
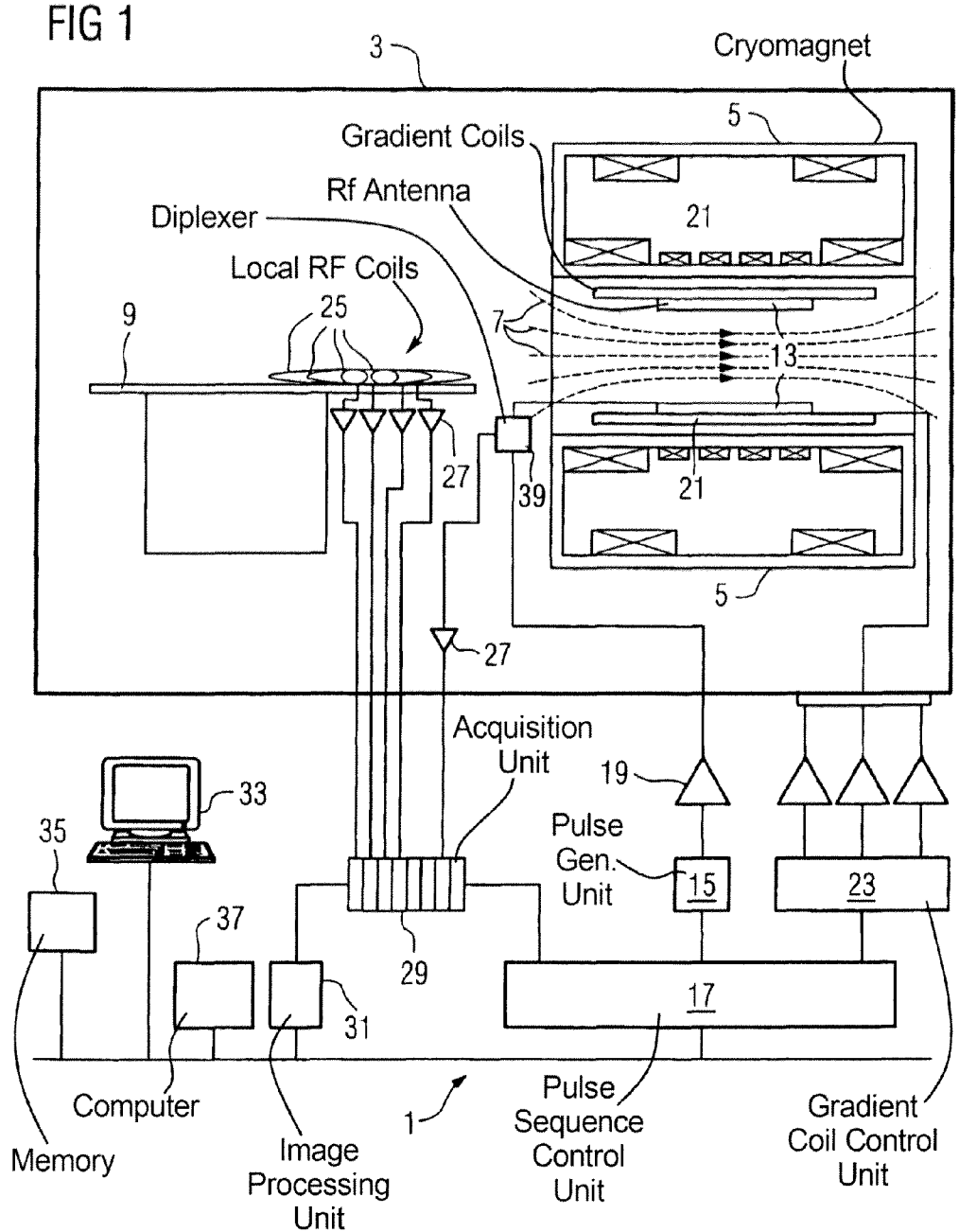
FIG. 1 is a schematic representation of a magnetic resonance apparatus with which the inventive method can be implemented.

FIG. 1 schematically shows the design of a magnetic resonance apparatus 1 with its basic components. In order to examine a body by means of magnetic resonance imaging, various magnetic fields tuned to one another as precisely as possible in terms of their temporal and spatial characteristics are applied.

A strong magnet (typically a cryomagnet 5 with a tunnel-shaped opening) arranged in a radio-frequency shielded measurement chamber 3 generates a static, strong basic magnetic field 7 that typically amounts to 0.2 Tesla to 3 Tesla and more. A body or a body part (not shown here) to be examined is borne on a patient bed 9 and positioned in the homogeneous region of the basic magnetic field 7.

The excitation of the nuclear spins of the body ensues via magnetic radio-frequency excitation pulses that are radiated via a radio-frequency antenna (shown here as a body coil 13). The radio-frequency excitation pulses are generated by a pulse generation unit 15 that is controlled by a pulse sequence control unit 17. After an amplification by a radio-frequency amplifier 19 they are relayed to the radio-frequency antenna. The radio-frequency system shown here is merely schematically indicated. Typically more than one pulse generation unit 15, more than one radio-frequency amplifier 19 and multiple radio-frequency antennas are used in a magnetic resonance apparatus 1.

Furthermore, the magnetic resonance apparatus 1 has gradient coils 21 with which magnetic gradient fields for selective slice excitation and for spatial coding of the measurement signal are radiated in a measurement. The gradient coils 21 are controlled by a gradient coil control unit 23 that, like the pulse generation unit 15, is connected with the pulse sequence control unit 27.

The signals emitted by the excited nuclear spins are acquired by the body coil 13 and/or by local coils 25, amplified by associated radio-frequency preamplifiers 27 and processed further and digitized by an acquisition unit 29.

Given a coil (such as, for example, the body coil 13) that can be operated both in transmission mode and in acquisition mode, the correct signal relaying is regulated by an upstream transmission-reception diplexer 39.

An image processing unit 31 generates from the measurement data an image that is presented to a user via an operator console 33 or is stored in a memory unit 35. A central computer 37 controls the individual system components. The computer 37 is thereby fashioned such that the method according to the invention can be implemented with it.

Figure 2:
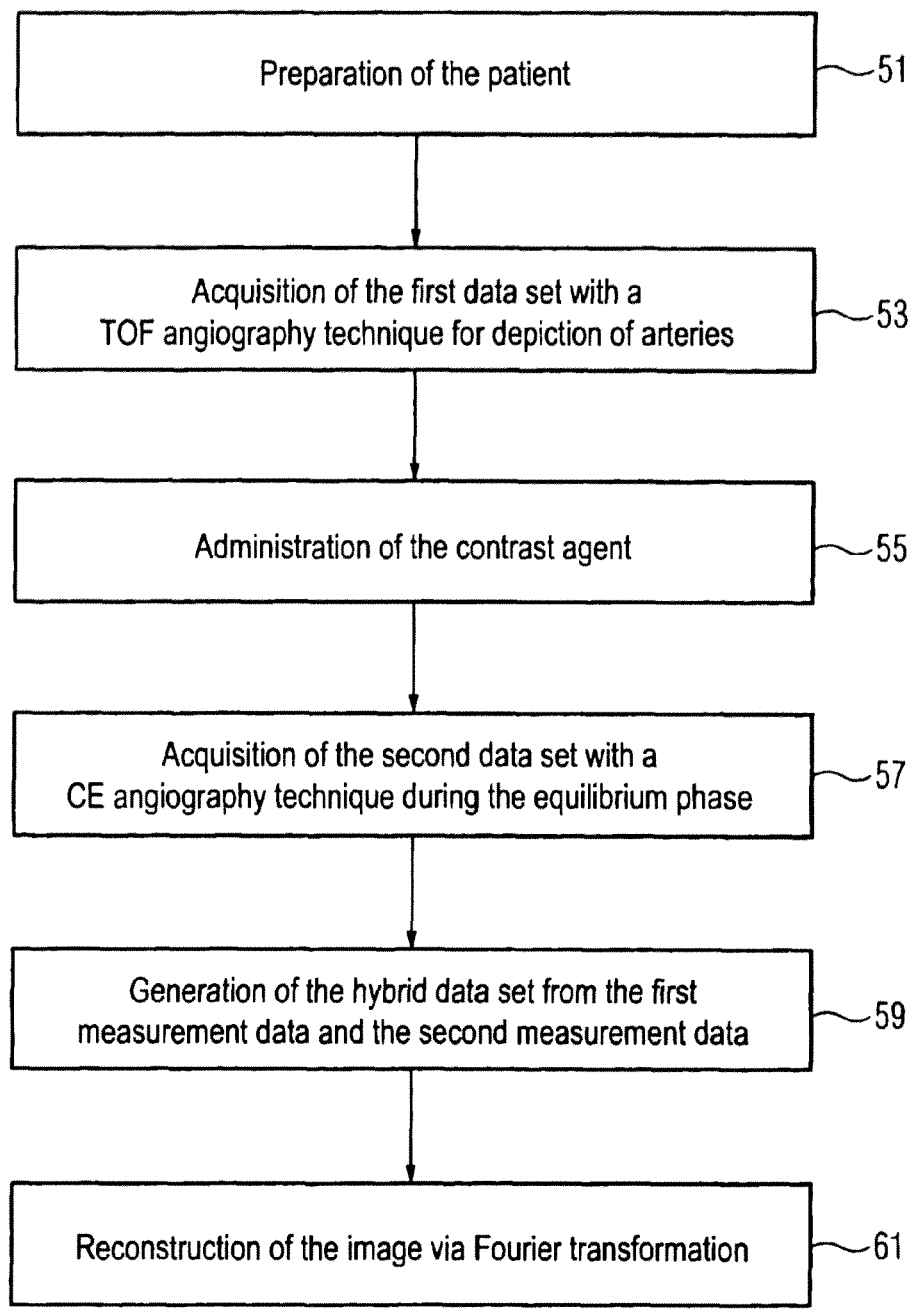
FIG. 2 is a schematic overview of individual steps of an embodiment of the method.

FIG. 2 schematically shows an overview of the method steps that are implemented in an embodiment of the method.

At the beginning of the method, in a first step a patient is prepared for the subsequent examination in an MR apparatus. This includes, among other things, placement of an intravenous access so that a contrast agent can be administered during the following MR examination as well as the positioning of the patient in the MR apparatus.

After the patient is positioned in the MR apparatus (for example a 1.5 Tesla MR apparatus), a first data set is acquired in a second step 53. This acquisition ensues with a contrast agent-free angiography technique such as, for example, with what is known as a time-of-flight angiography technique.

For example, if the vascular system of the brain should be examined, the first data set can be a 3D-TOF data set that has an isotropic resolution of 1 mm×1 mm×1 mm with a field of view of 256 mm×256 mm in, for example, 64 partitions with 1 mm thickness each. The acquisition of the 3D-TOF data set can ensues within 7 minutes, for example.

The TOF angiography technique is thereby optimized for sole depiction of the arteries. This can ensue with the use of a correspondingly selected timing between saturation pulses and subsequent data acquisition segments, for example.

After the first data set has been acquired with the aid of the TOF angiography technique, a contrast agent (for example based on gadolinium such as, for example, 10 ml gadofosveset trisodium, available under the name Vasovist, from Schering) is administered to the patient in a third step 55. The contrast agent is thereby what is known as a blood pool contrast agent that distributes in the blood after a short-term arterial phase and is present both in the arteries and veins in the subsequent equilibrium phase. The equilibrium phase, in which the entire vascular system to be examined is marked, typically lasts a few minutes to a few dozen minutes.

An acquisition of the second data set ensues at this time in a fourth step 57. This time the acquisition ensues via a contrast agent-assisted angiography technique, for example via a FL3D-ce technique (for three-dimensional "fast low-angle shot" technique; "ce" thereby stands for "contrast enhanced"). Since sufficient time is available for the acquisition, the acquired 3D ce-data set can have an isotropic resolution of, for example, 0.5 mm×0.5 mm×0.5 mm in all three spatial directions with a field of view of 256 mm×256 mm given, for example, 128 partitions with 0.5 mm thickness each. The acquisition of the second data set can ensue within 10 minutes, for example.

The first data set and the second data set consequently exhibit the same dimensions in image space, wherein the resolution of the second data set in each spatial dimension is twice as high as the resolution of the first data set.

The two data sets are combined with one another into a hybrid data set in a fifth step 59 in k-space. Details for combination are explained using subsequent FIGS. 3 through 5. Given the combination a central k-space region of the hybrid data set is populated with first measurement data of the first data set. By contrast, a peripheral k-space region of the hybrid data set can be populated with the second measurement data of the second data set.

In another embodiment the hybrid data set can be generated such that the first measurement data and the second measurement data are added to one another with weighting. The weighting in the central k-space region hereby lines on the side of the first data while the weighting lies on the side of the second measurement data in a peripheral k-space region.

The new hybrid data set arising via the combination consequently has the same spatial dimensions in image space as the first data set or, respectively, the second data set, however exhibits the higher spatial resolution of the second data set. While arteries cannot be shown separately from veins in an image that would be reconstructed solely from the second data set, this is now possible in a reconstructed image that is reconstructed from the combined data set. This is based on the fact that a central k-space region is populated with the first measurement data of the first data set and the first data set is acquired such that arteries are presented with a good signal-noise ratio in associated image contrast.

Through the combination of the two data sets, a hybrid data set consequently arises with a contrast-determining portion of the first data set and with a contribution of the higher spatial frequencies of the second data set.

In a subsequent sixth step 61 an angiographic image is reconstructed from the hybrid data set in that a Fourier transformation is implemented. For example, MIP presentations can be generated from the image data set so obtained (MIP for "maximal intensity projection").

Examinations of MR angiographies of cerebral arteries have thereby shown that the image reconstructed from the hybrid data set possesses a voxel resolution that exhibits an eight-fold higher resolution relative to an image reconstructed form the 3D-TOF data set. An image reconstructed from the 3D-TOF data set exhibits an arterial contrast with a contrast-noise ratio of approximately 29.7. This contrast response is largely also retained in the image reconstructed from the hybrid data set, which possesses a contrast-noise ratio of approximately 25.0.

In another embodiment variant the high-resolution data set can be used as a mask for the depiction of the veins. The veins can likewise be shown separately and in high resolution via the use of the mask.

Figure 3:
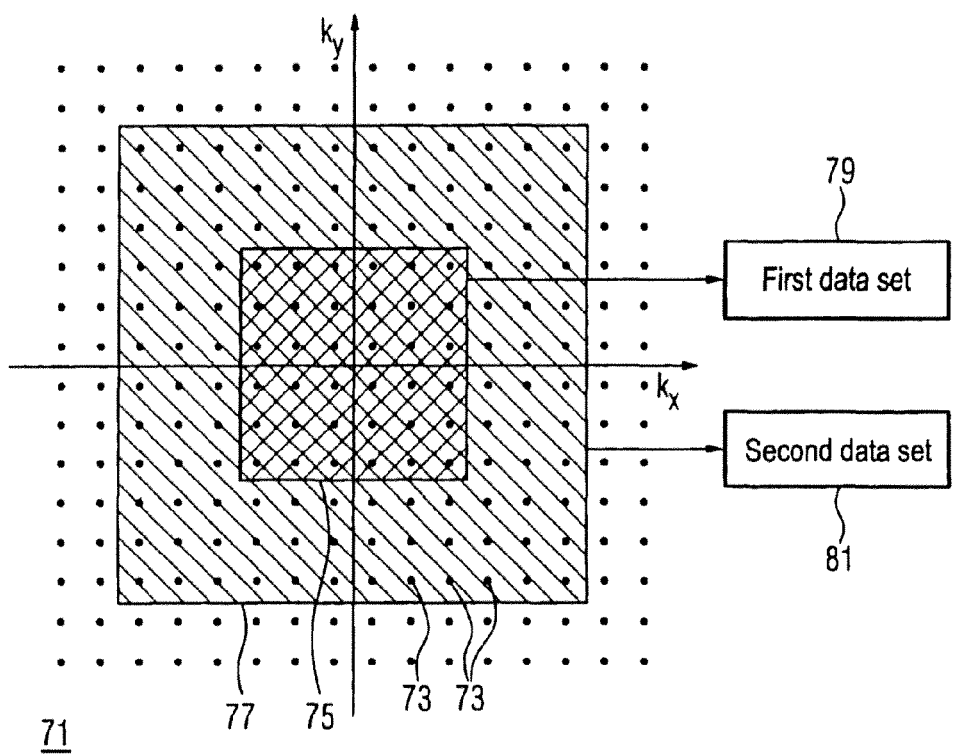
FIG. 3 is a depiction of k-space with the k-space regions being identified that are scanned in the acquisition of the first data set and of the second data set in accordance with the invention.
Figure 4:
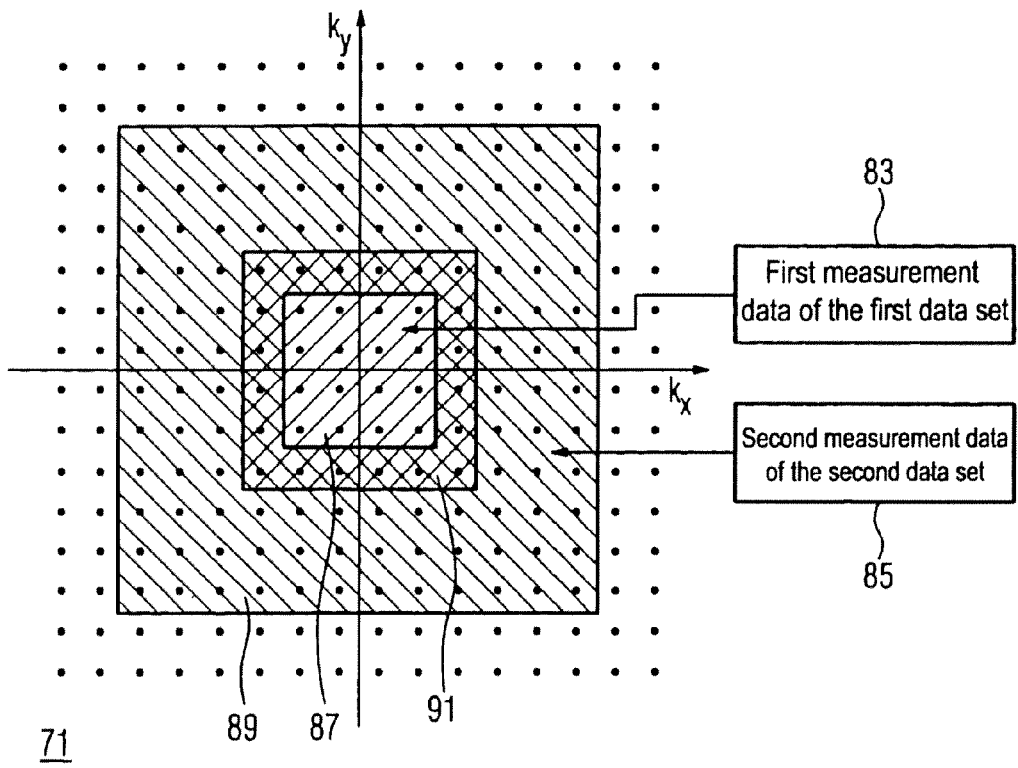
FIG. 4 is a depiction of k-space with the k-space regions that are populated with measurement data of the first data set and measurement data of the second data set being identified in the generation of the hybrid data set in accordance with the invention.
Figure 5:
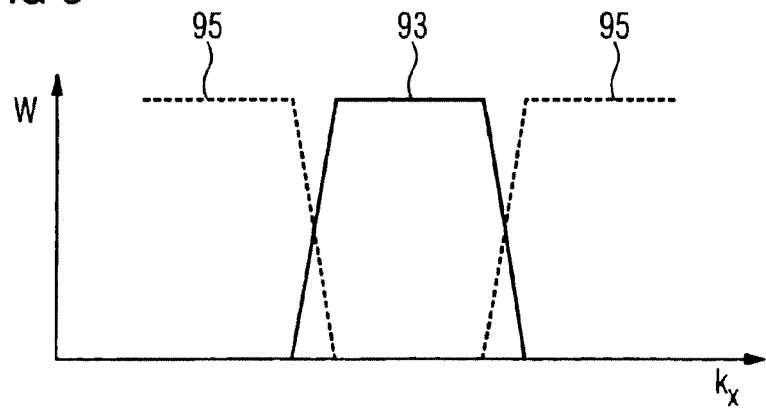
FIG. 5 shows the curve of the weighting factors along a k-space coordinate in accordance with the invention.

In the following the spatial relationships in k-space that serve for comprehension of the present invention are explained in detail using FIG. 3 through FIG. 5. FIG. 3 through FIG. 5 are only schematic representations with which aspects of the underlying invention should be explained using a representation of k-space.

FIG. 3 shows schematically presented k-space 71. K-space 71 is shown in two dimensions for simplicity. The individual points represent coordinate points 73 in k-space 71 that can be populated with acquired measurement data.

A central k-space region 75 represents that k-space region that is scanned by the contrast agent-free angiography technique in the acquisition of the first data set 79. The expanded k-space region 77 represents that k-space region that is scanned via the acquisition of the second data set 81 with a contrast agent-assisted angiography technique.

FIG. 4 shows the same schematic, two-dimensional k-space 71 shown in FIG. 3. Different regions of this k-space 71 are populated with first measurement data 83 of the first data set 79 or with second measurement data 85 of the second data set 81 in the generation of the hybrid data set, or different regions of k-space 71 are populated with data that arise from a weighted addition of the first measurement data 83 and the second measurement data 85.

In the specific example shown in FIG. 4, an inner k-space region 87 is populated with the first measurement data 83 of the first data set 79. An external k-space region 89, i.e. a peripheral k-space region, is populated with the second measurement data 85 of the second data set 81. Between the inner k-space region 87 and the outer k-space region 89 is a transition region 91 in which the first measurement data 83 of the first data set 79 and the second measurement data 85 of the second data set 81 are added with weighting such that a steady transition occurs from the first measurement data 83 of the first data set 79 of the inner k-space region 87 to the second measurement data 85 of the second data set 81 of the outer k-space region 98.

The weighted addition can be explained better via the presentation of the weighting factors in FIG. 5. For simplicity the weighting factor W is presented only along one k-space axis, for example the kx-axis. It can be seen that a first weighting factor 93 (represented with solid line) with which the first measurement data 83 of the first data set 79 are weighted decreases moving outward in the transition region 91. A second weighting factor 95 (represented with dashed line) with which the second measurement data 85 of the second data set 81 are weighted increases moving outward in the transition region 91.

The presented weighting factors are only one possibility of many, and can be varied in different ways. For example, it is possible to place the inner k-space region and the outer k-space region such that no transition region arises in which the weighting factors decrease or increase. The weighting factors also do not have to proceed linearly in the transition region as shown herein, but can assume a different curve course. The reconstructed image likewise can be influenced by scaling the inner k-space region 87 and the outer k-space region 89.

Although modifications and changes may be suggested by those skilled in the art, it is the intention of the inventor to embody within the patent warranted hereon all changes and modifications as reasonably and properly come within the scope of his contribution to the art.

I claim as my invention:

1. A method for generating a magnetic resonance angiographic image of a vascular system of a subject, comprising the steps of:
   acquiring a first magnetic resonance data set from a region of a subject using a contrast agent-free magnetic resonance angiography data acquisition technique, and entering said first magnetic resonance data set into k-space as first k-space data;
   acquiring a second magnetic resonance data set from said region of the subject using a contrast agent-aided magnetic resonance angiography data acquisition technique, and entering said second magnetic resonance data set into k-space as second k-space data; and
   reconstructing an angiographic image of said region using both said first k-space data and said second k-space data.

2. A method as claimed in claim 1 comprising generating a hybrid data set in k-space from said first k-space data and said second k-space data, and reconstructing said angiographic image from said hybrid data set using a Fourier transformation thereof.

3. A method as claimed in claim 2 comprising generating said hybrid data set in k-space by adding said first k-space data and said second k-space data with respective weighting, with said first k-space data being more strongly weighted in a central region of k-space than said second k-space data, and said second k-space data being more strongly weighted than said first k-space data in a peripheral region of k-space.

4. A method as claimed in claim 2 comprising generating said hybrid data set in k-space by populating a central region in k-space of said hybrid data set with said first k-space data and populating a peripheral region of k-space of said hybrid data with said second k-space data.

5. A method as claimed in claim 1 comprising acquiring said first magnetic resonance data set and said second magnetic resonance data set to cause said first k-space data and said second k-space data to have the same dimensions in k-space.

6. A method as claimed in claim 1 comprising acquiring said first magnetic resonance data set and said second magnetic resonance data set to cause said second magnetic resonance data set to exhibit a higher spatial resolution in image space than said first magnetic resonance data set.

7. A method as claimed in claim 1 comprising acquiring said first magnetic resonance data set with a time-of-flight angiography technique as said contrast agent-free magnetic resonance angiography data acquisition technique, that causes an arterial region of the vascular system to be represented by said first magnetic resonance data.

8. A method as claimed in claim 1 comprising acquiring said second magnetic resonance data set with said contrast agent-aided magnetic resonance angiography data acquisition technique at a point in time at which a contrast agent, introduced into the vascular system, is located both in arteries and in vein of the subject.

9. A method as claimed in claim 1 comprising acquiring said first magnetic resonance data set and said second magnetic resonance data set in succession in a single magnetic resonance examination of the subject.

10. A method as claimed in claim 1 comprising acquiring said first magnetic resonance data set and said second magnetic resonance data set from the cranial vascular system of the subject, as said region.

11. A magnetic resonance apparatus for generating a magnetic resonance angiographic image of a vascular system of a subject, said apparatus comprising:

a magnetic resonance data acquisition unit configured to interact with a subject to acquire magnetic resonance data from the subject;

a contrast agent injector configured to interact with the subject to inject contrast agent into the subject that enhances visualization of at least a portion of the vascular system of the subject;

a control unit that operates said magnetic resonance data acquisition unit and said contrast agent injector to acquire a first magnetic resonance data set from a region of the subject using a contrast agent-free magnetic resonance angiography data acquisition technique, and to acquire a second magnetic resonance data set from the region of the subject using said contrast agent injector in a contrast agent-aided magnetic resonance angiography data acquisition technique;

a memory, accessible by said control unit, representing k-space, said control unit entering said first magnetic resonance data into said memory as first k-space data and entering said second magnetic resonance data into said memory as second k-space data; and an image reconstruction computer having access to said memory that reconstructs an angiographic image of said region using both said first k-space data and said second k-space data.

* * * * *